United States Patent

Cooper et al.

[11] Patent Number: 5,892,659
[45] Date of Patent: Apr. 6, 1999

[54] RETENTION SYSTEM FOR SOLENOID COILS

[75] Inventors: Ralph Melvin Cooper, Clemmons; Galen Monroe Martin, Jamestown, both of N.C.

[73] Assignee: The Whitaker Corporation, Wilmington, Del.

[21] Appl. No.: 755,856

[22] Filed: Dec. 2, 1996

Related U.S. Application Data

[60] Provisional application No. 60/008,443 Dec. 12, 1995.

[51] Int. Cl.⁶ ........................................... H05K 7/16
[52] U.S. Cl. .................. 361/727; 361/658; 361/747; 174/48; 174/49; 174/50; 220/4.02; 439/575
[58] Field of Search .................... 361/727, 658, 361/752, 814, 825; 220/306, 4.02, 3.9, 3.6; 174/48, 49, 50

[56] References Cited

U.S. PATENT DOCUMENTS

| | | | |
|---|---|---|---|
| 4,840,286 | 6/1989 | Heberling et al. | 220/4.02 |
| 5,383,098 | 1/1995 | Ma et al. | 361/818 |
| 5,449,227 | 9/1995 | Steinberg et al. | 303/119.2 |
| 5,516,984 | 5/1996 | Soes et al. | 174/65 R |
| 5,563,761 | 10/1996 | Apa et al. | 361/119 |
| 5,613,237 | 3/1997 | Bent et al. | 220/4.02 |

Primary Examiner—Leo P. Picard
Assistant Examiner—Boris L. Chervinsky
Attorney, Agent, or Firm—Bradley N. Ditty

[57] ABSTRACT

The invention comprises a retention system for retaining a component within a housing, the system having a body to receive the component therein. The body has a bottom wall against which the component will be mounted. A resiliently deflectable latching arm extends upwardly from the bottom wall. The latching arm has a lower section, an angled section, and a latching section. The angled section has an opening therein. The latching section offset section has a latching surface. The opening receiving a latching tooth therein and the latching surface engaging the latching tooth to secure the component.

10 Claims, 2 Drawing Sheets

5,892,659

RETENTION SYSTEM FOR SOLENOID COILS

This application claims the benefit of U.S. Provisional Application(s) No.(s) 60/008,443, Filed Dec. 12, 1995.

The present invention relates to a structural system for retaining electrical components, for example, solenoid coils, in an electrical connector housing.

BACKGROUND OF THE INVENTION

U.S. Pat. No. 5,449,227 discloses a solenoid attachment for a vehicle antilock brake system. The solenoid attachment includes a housing into which a plurality of solenoid assemblies are inserted. The solenoid assemblies are secured within the housing by a retention ring from which retention snaps, or latching arms, extend. The retention snaps are secured to a latching wall within the housing.

What is needed is a latching system which is easily molded.

SUMMARY OF THE INVENTION

The invention comprises a retention system for retaining a component within a housing, the system having a body to receive the component therein. The body has a bottom wall against which the component will be mounted. A resiliently deflectable latching arm extends upwardly from the bottom wall. The latching arm has a lower section, an angled section, and a offset section. The angled section has an opening therein. The latching section has a latching surface. The opening receiving a latching tooth therein and the latching surface engaging the latching tooth to secure the component.

The invention further comprises a retention system for retaining a component within a housing. The system has a body to receive the component therein. The body has a bottom wall against which the component will be mounted. A latching arm extends upwardly from the bottom wall. The latching arm has an opening for receiving a latching tooth on the component therein. The opening and the latching tooth cooperate to secure the component within the housing. A seal is disposed between the component and the bottom wall, the seal being retained by the interaction of the latching tooth and the opening.

DETAILED DESCRIPTION OF THE INVENTION

Figure 1:
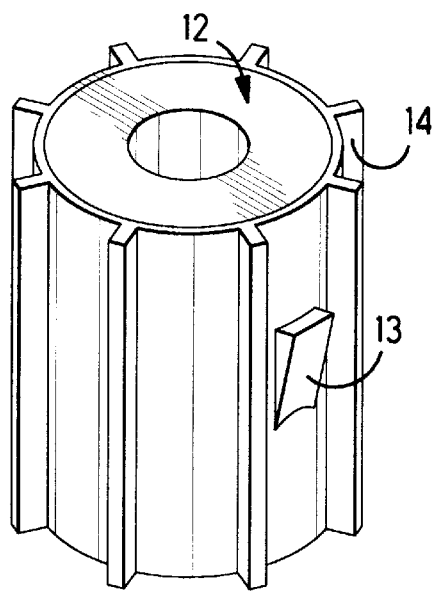
FIGS. 1–4 show a latching system for retaining a solenoid coil in an electrical housing according to the present invention.
Figure 2:
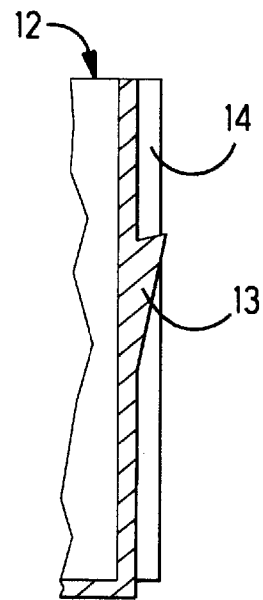
Figure 3:
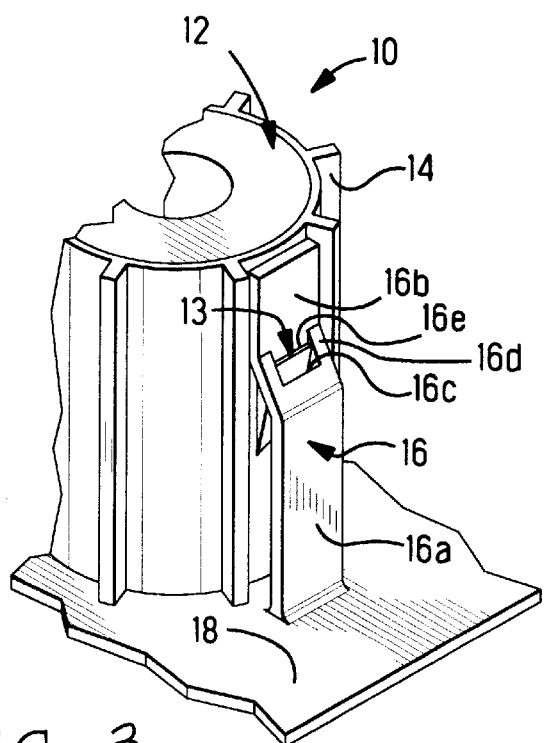
Figure 4:
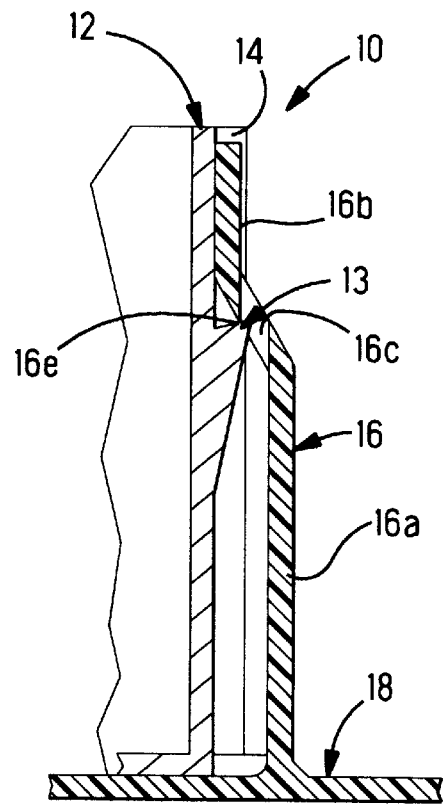

Referring to FIGS. 1–4, a preferred embodiment of the present invention will be described. Latching system 10 shown in FIGS. 3–4 includes an electrical component 12, for example, a solenoid coil, wherein the electrical component 12 includes at least a pair of opposed latched teeth 13 (only one being shown in the drawing). The electrical component 12 further includes a plurality of optional polarizing ribs 14. Housing 18 includes an latching arm 16 integrally formed in the housing 18 and extending upwardly therefrom. The latching arm 16 includes a lower section 16a extending upwardly from the housing, an angled section 16d extending from the lower section 16a to an offset section 16b at a terminal end of the latching arm 16, and a tooth receiving hole 16c in the angled section 16d formed by passing cores during the molding process of the electrical connector housing 18. The latching arm 16 flexes during molding core retraction at the time of molding or part ejection. This preferred embodiment of latching system 10 is advantageous because no holes need be made in the floor of housing 18 during the formation process, and yet a tooth receiving hole 16c can be made in latching arm 16 for the purpose of receiving latch tooth 13 of electrical component 12 therein as shown in FIG. 4 and also shown in FIG. 3. In operation, the electrical component 12, prior to assembly, is moved towards housing 18, and latching arm 16 will be guided by and between ribs 14. The tapered lower surface of tooth 13 will engage and deflect latching arm 16 away from electrical component 12 until the tooth 13 passes hole 16c and the tooth 13 will go into holes 16c thereby engaging latching surface 16e and latching component 12 to housing 18.

Figure 5:
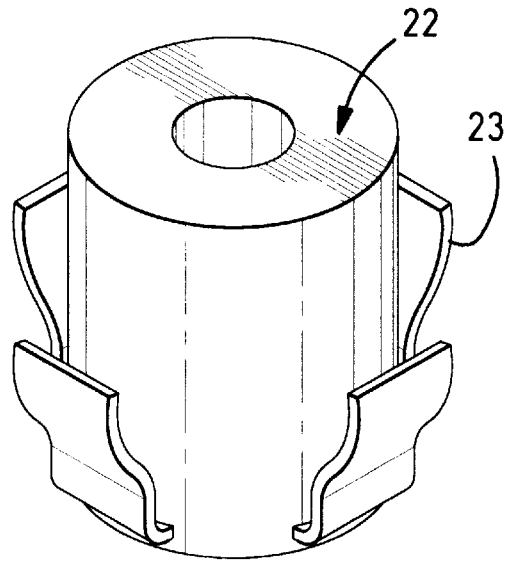
FIGS. 5–6 show a second embodiment of a latching system for retaining solenoid coils in an electrical connector housing.
Figure 6:
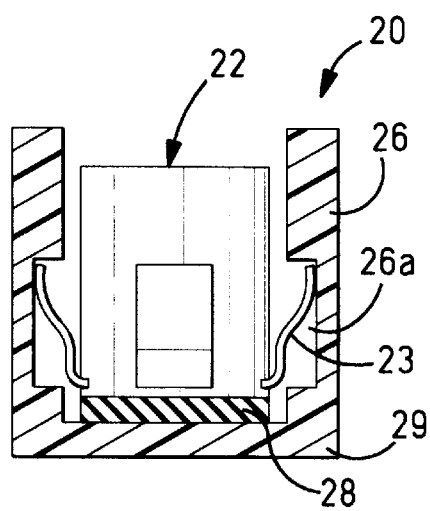

FIGS. 5 and 6 refer to a second embodiment of the present invention whereby latching system 20 is formed between electrical component 22 and housing 29. Prior art FIG. 5, however, shows a known electrical component 22. Electrical component 22 includes resilient latching members 23 molded integrally therewith. Housing 29 includes a housing wall 26 having recesses 26a respectively formed therein for receiving respective latch members 23. Additionally, a seal 28, according to the present invention, is disposed on a bottom surface of electrical component 22. This is necessary because the housing 29 will have holes in it and the bottom of component 22 requires a seal therearound to prevent contaminants from passing through housing 29. Latching system 20 may be relatively costly to mold because of the recesses or molded undercuts 26a which must be formed in housing wall 26.

Figure 7:
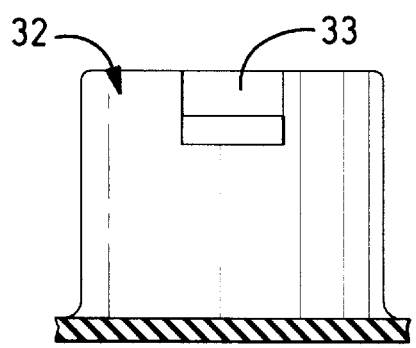
FIGS. 7–8 show a third embodiment of the present invention comprising a latching system for retaining solenoid coils in an electrical connector housing.
Figure 8:
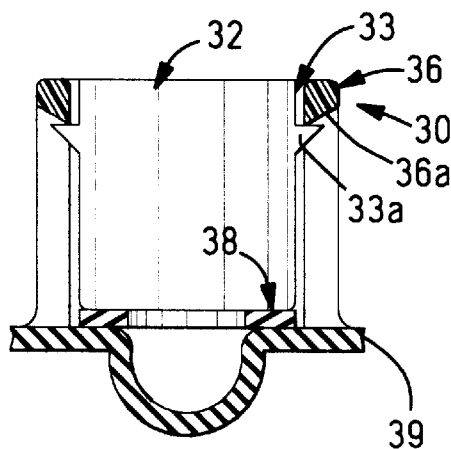

FIGS. 7 and 8 show a further latching system 30 which includes an electrical component 32 with teeth 33a formed in skived grooves 33. The skivings 33 are formed from the top down with a suitable tool, and result in the formation of the sharpened teeth 33a which are arranged to latchably engage deflectable beams 36 which each have a respective undercut 36a formed thereon for engagement with teeth 33a. Beams 36 are formed by passing mould cores and the beams flex during the mold retraction or ejection, and which forming process is used to form latching arm 16 of latching system 10. A compressible seal 38 is disposed between electrical component 32 and housing 39 to form a spring for upper pressure on 36a.

Figure 9:
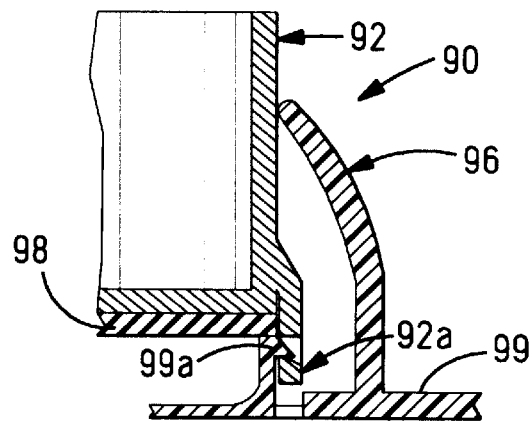
FIG. 9 shows a fourth embodiment of a latching system for retaining solenoid coils in an electrical connector housing.

Prior art FIG. 9 shows a known latching system 90. Beams 96 are arranged to frictionally engage an electrical component 92 which has a tooth 92a which projects from a bottom surface thereof. A seal 98 is located between the bottom surface of electrical component 92 and the tooth 92a for sealing the bottom surface thereof. Beams 96 project from insulating housing 99. This beam structure only applies pressure on the coil 92 and somewhat centers it to its proper location in the housing but latching must be done by cantilevered beam 92a. The tooth 99a is formed on housing 99 for receiving and latchably engaging beam 92*a*. Compressed seal 98 is disposed between electrical component 92 and housing 99 to form a spring force to keep beam 92*a* in tension and thereby defines a positive latch.

Figure 10:
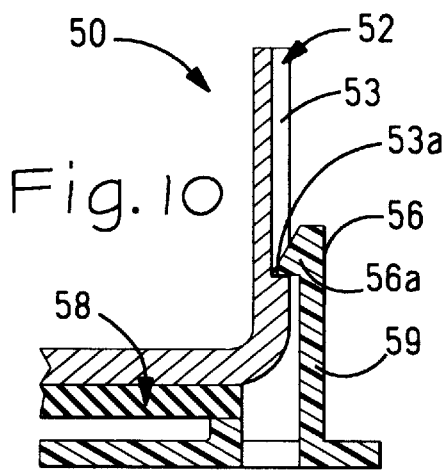
FIG. 10 shows a fourth embodiment of a latching system for retaining solenoid coils in an electrical connector housing.

Now referring to FIG. 10, latching system 50 will be described. Latching system 50 includes an electrical component 52 with at least one skived groove 53 therein having a latch receiving ledge 53*a* located at a bottom thereof. Housing 59 includes respective, integrally formed beams 56 for each respective groove 53, whereby a tooth 56*a* of each beam 56 is arranged for latching engagement with a respective ledge 53*a* of component 52. A seal 58 is compressibly located between a bottom surface of component 52 and housing 59 for providing a sealing interface therebetween, and for upwardly biasing the component 52 against the latch beam 56.

It should be noted that the grooves 33 and 53 can be formed by techniques other than skiving, for example, machining or milling techniques. Additionally, an advantage of the present invention resides in the fact that cores can be strategically placed to form the latching features of the latching beams, and the beams, so formed, thereby increase the retention capabilities of the overall latching system.

What is claimed is:

1. A retention system for retaining a component within a housing, comprising:

a body to receive the component therein, the body having a bottom wall against which the component will be mounted; and a resiliently deflectable latching arm extending upwardly from the bottom wall, the latching arm having a lower section, an angled section extending from the lower section, and an offset section extending from the angled section, the angled section having an opening therein, the offset section having a latching surface, the opening receiving a latching tooth therein, the latching surface engaging the latching tooth to secure the component.

2. The retention system of claim 1, wherein the angled section is disposed at approximately 60° from the lower section.

3. The retention system of claim 1, wherein the lower section extends perpendicular to the bottom wall.

4. The retention system of claim 3, wherein the offset section extends substantially parallel to the lower section.

5. The retention system of claim 1, wherein the latching arm is integrally formed with the body.

6. An electrical connector housing into which an electrical component is secured, comprising:

a body to receive the component therein, the body having a bottom wall against which the component will be mounted, a latching arm extending from the bottom wall, the latching arm having a lower section extending from the lower section and an offset section having a latching surface thereon, the offset section extending upwardly from the angled section.

7. The electrical connector of claim 6, wherein the angled section is disposed at approximately 60° from the lower section.

8. The electrical connector of claim 6, wherein the lower section extends perpendicular to the bottom wall.

9. The electrical connector of claim 8, wherein the offset section extends substantially parallel to the lower section.

10. The retention system of claim 6, wherein the latching arm is integrally formed with the body.

* * * * *